United States Patent
Zhang et al.

(10) Patent No.: US 11,188,404 B2
(45) Date of Patent: Nov. 30, 2021

(54) METHODS OF DATA CONCURRENT RECOVERY FOR A DISTRIBUTED STORAGE SYSTEM AND STORAGE MEDIUM THEREOF

(71) Applicant: HERE DATA TECHNOLOGY, Guangdong (CN)

(72) Inventors: Jingyao Zhang, Guangdong (CN); Jian Zhu, Guangdong (CN); Bin Hao, Guangdong (CN)

(73) Assignee: HERE DATA TECHNOLOGY, Shenzhen (CN)

(*) Notice: Subject to any disclaimer, the term of this patent is extended or adjusted under 35 U.S.C. 154(b) by 0 days.

(21) Appl. No.: 17/059,439

(22) PCT Filed: Jul. 10, 2018

(86) PCT No.: PCT/CN2018/095085
§ 371 (c)(1),
(2) Date: Nov. 29, 2020

(87) PCT Pub. No.: WO2020/010505
PCT Pub. Date: Jan. 16, 2020

(65) Prior Publication Data
US 2021/0216390 A1    Jul. 15, 2021

(51) Int. Cl.
*G06F 11/07*    (2006.01)
*G06F 11/10*    (2006.01)
*G06F 11/14*    (2006.01)

(52) U.S. Cl.
CPC ...... *G06F 11/0709* (2013.01); *G06F 11/0772* (2013.01); *G06F 11/1004* (2013.01); *G06F 11/1464* (2013.01); *G06F 11/1469* (2013.01)

(58) Field of Classification Search
CPC ............ G06F 11/0709; G06F 11/1469; G06F 11/1004; G06F 11/0772; G06F 11/1464
USPC ........................................................ 714/15
See application file for complete search history.

(56) References Cited

U.S. PATENT DOCUMENTS

| 8,631,269 B2 * | 1/2014 | Vinayak | H03M 13/373 714/4.11 |
| 2017/0046227 A1 * | 2/2017 | Fan | G06F 11/1088 |

* cited by examiner

*Primary Examiner* — Yair Leibovich

(57) ABSTRACT

Disclosed is a method of data concurrent recovery for a distributed storage system, that is, a method for synchronous repair of multiple failed nodes with a minimum recovery bandwidth when a node in a distributed storage system fails. First an assistant node is selected to get helper data sub-block, then the repair matrix related to the data block stored in the node to be repaired is constructed, and finally the lost data block is reconstructed by multiplying the repair matrix and the helper data helper data sub-block; the missing data block is reconstructed by decoding, wherein the node to be recovered includes all failed systematical nodes, or all or partly failed parity nodes. The method is applicable to concurrently recover multiple failed nodes at minimal recovery bandwidth, and the nodes to be recovered are selected according to the demand to reduce the recovery bandwidth as much as possible.

8 Claims, 3 Drawing Sheets

METHODS OF DATA CONCURRENT RECOVERY FOR A DISTRIBUTED STORAGE SYSTEM AND STORAGE MEDIUM THEREOF

TECHNICAL FIELD

The present disclosure relates to the field of distributed storage, and in particularly, to methods of concurrent recovery for one or more failed nodes.

BACKGROUND

Distributed storage systems are widely used in storage technology because of their high availability, high scalability, and efficient storage capacity for massive data. However, it is inevitable that a storage node in a distributed storage system will suffer from failure due to various reasons and lose its ability to externally provide data services, thus becoming a failed node. Conventionally redundancy such as replication or erasure coding has been adopted to ensure data security and uninterruptedly provide external services. Comparatively speaking, replication is wasteful in space usage while erasure coding, though it has relatively higher space utilization, is inefficient in network bandwidth for failed node(s) repairing. Specifically, even if only one node fails in a distributed storage system with erasure code, a complete data segment must be collected through network to regenerate a small portion of data blocks stored on the failed node. "Regenerating Code", a novel encoding technique, came into being to eliminate this issue. Generally a generating code also has the properties of Maximum Distance Separable (MDS) like erasure code, but when repairing the failed node(s), only a small portion of the whole data segment needs to be collected/downloaded, hence the network bandwidth can be largely saved and the overall system performance can be enhanced significantly.

In the theoretical framework of generating code, there are two bound limits for the trade-off between recovery bandwidth and storage space efficiency, called "Minimum Bandwidth Regenerating" (MBR) and "Minimum Storage Regenerating" (MSR) respectively. They also represent two main categories of regeneration codes. MBR codes can achieve the theoretical lower bound of minimum recovery bandwidth on the trade-off curve, but its storage efficiency is not the highest; whereas MSR codes can touch the other endpoint of the curve, which can maximize the storage efficiency and meanwhile minimizing the recovery bandwidth given the storage efficiency. Another criteria divides regenerating codes into exact generating codes and functional generating codes. When a node fails, the data blocks recovered by exact generating codes are exactly identical to the missing one on the failed node, while those recovered by functional regenerating codes may be different, only maintaining the properties of MDS and MBR/MSR.

Currently typical exact MSR codes include the one using Product Matrix (PM) and another one using Interference Alignment (IA). However, original versions of them only address single node failure. Since concurrent node failures are very common in practical distributed storage systems, it is necessary to have solutions for multiple failures recovery. Some previous research proposed cooperative concurrent recovery strategies, with which the new nodes (substituting failed nodes) not only download data from surviving nodes (which never fail) but also exchange information with each other, achieving concurrently recovering multiple data blocks. In this way, the total repair bandwidth can be reduced or even achieve the lower bound. However, the coordination among the nodes makes the implementation complicated. Moreover, it may increase the overhead and the completion time of recovery.

A method that can jointly recover multiple missing data blocks for both PM and IA codes and does not need the cooperation between new nodes was proposed. However, the method needs to solve large equations, which is not very efficient in practice.

SUMMARY

The present application provides a method of data concurrent recovery for a distributed storage system by using minimum storage generating code based on interference alignment. The main technical problem to be solved herein is to provide method of data concurrent recovery for a distributed storage system that can concurrently recover multiple failed nodes in the distributed storage system. In the recovery method, the storage nodes are divided into systematical nodes and parity nodes, and the actual repaired nodes i.e. the nodes to be recovered include all failed systematical nodes and all or partly failed parity nodes.

The process of data recovery may include the following steps:

step 1: selecting assistant nodes from surviving nodes, and based on the distribution of the failed nodes in the list of nodes to be recovered, the assistant nodes sending encoded helper data sub-blocks and/or its stored data sub-blocks to the regenerating node;

step 2: setting sub-repair matrices related to missing systematical data blocks and parity blocks, respectively; and step 3: setting a repair matrix and regenerating the missing data blocks.

During actual recovery, the list of nodes to be recovered should be selected based on actual needs. That is, when there are many surviving parity nodes, all the lost data blocks can be repaired, instead, some of the failed nodes can be repaired as needed. At the same time, when too many failed nodes reach a certain number, the lost data blocks should be reconstructed by decoding.

The beneficial effect of the present disclosure is that by providing the method of data concurrent recovery for a distributed storage system using minimum storage generating code based on interference alignment, one or more failed nodes in the distributed storage system can concurrently recover at minimal recovery bandwidth, and the nodes to be recovered are selected according to the demand to reduce the recovery bandwidth and the time and overhead required for repair as much as possible.

DETAILED DESCRIPTION

Figure 1:
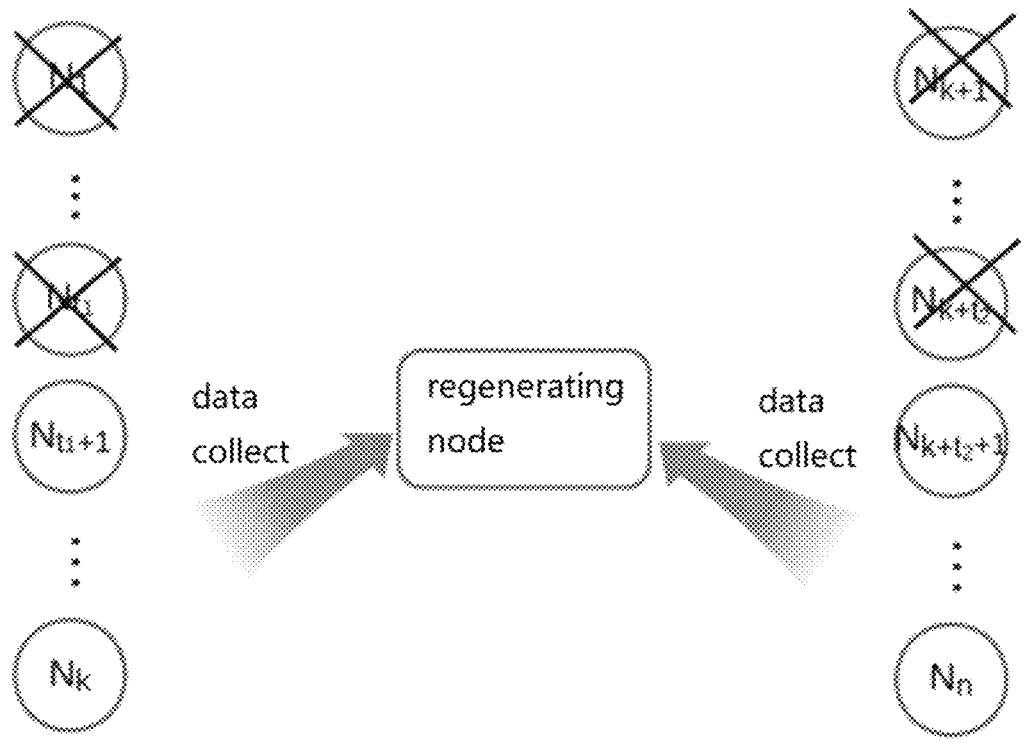
FIG. 1 is a schematic diagram of system model of data concurrent recovery.

The present disclosure will be further described in detail below through specific embodiments in combination with the accompanying drawings. Many details described in the following embodiments are for the purpose of better understanding the present disclosure. However, a person skilled in the art can realize with minimal effort that some of these features can be omitted in different cases or be replaced by other methods. For clarity some operations related to the present disclosure are not shown or illustrated herein so as to prevent the core from being overwhelmed by excessive descriptions. For the person skilled in the art, such operations are not necessary to be explained in detail, and they can fully understand the related operations according to the description in the specification and the general technical knowledge in the field.

In addition, the features, operations or characteristics described in the specification may be combined in any suitable manner to form various embodiments. At the same time, the steps or actions in the described method can also be sequentially changed or adjusted in a manner that can be apparent to those skilled in the art. Therefore, the various sequences in the specification and the drawings are only for the purpose of describing a particular embodiment, and are not intended to be an order of necessity, unless otherwise stated one of the sequences must be followed.

In a method of recovering data concurrently for a distributed storage system proposed in the present disclosure, data recovery is implemented by means of: dividing the storage nodes into systematical nodes and parity nodes, constructing sub-repair matrices in relation to missing data blocks respectively, determining a repair matrix, and multiplying helper data sub-blocks with the repair matrix to obtain the missing data blocks. This method can concurrently recover one or more failed nodes in a distributed storage system.

The policies of data recovery can be divided into two modes in the present disclosure. One is a centralized mode, in which an "agent" node will collect helper data obtained by encoded assistant nodes or data stored by the assistant node itself, then constructing a repair matrix and reconstructing missing data blocks, and finally transmitting the repaired data to a corresponding new node. The other one is a distributed mode, in which a new node itself will collect the helper data obtained by encoded assistant node or the data stored by the assistant node itself, and then construct a repair matrix and regenerate the missing data block. Note that the new node is only responsible for reconstructing the lost data on the failed node that it replaced. These two recovery modes have their own advantages and disadvantages and applicable occasions. The method of recovering data concurrently for a distributed storage system using minimum storage generating code based on interference alignment is applicable to these two recovery modes. In any mode and especially the distributed mode, a regenerating node probably does not need to regenerate all the missing data blocks. The regenerating node may refer to a proxy node in the centralize mode or a new node in the distributed mode. Theoretically, it has been proved that the smaller the number of missing data blocks to be recovered is, the less the required recovery bandwidth is, if there are enough number of surviving nodes. However, in our research, we find that for IA codes, all missing systematical data blocks must be jointly recovered; otherwise, the repair matrix cannot be generated and recovery will fail. Hence, an assistant node selection method is needed to ensure successful failure recovery and meanwhile minimize the recovery bandwidth usage.

To make the disclosure clear and concise, it will first present the system model and notions used throughout herein. An IA code is denoted by $C(n,k,d)$, where n is the total number of storage nodes, k is the number of "systematical nodes" on which original data is stored, and $m=n-k$ is the number of "parity nodes" on which encoded data blocks are located. d is "repair degree" which is the number of assistant nodes needed in recovery when there is only one failed node out of the total n nodes. IA code requires that $n \geq 2k$ and $d \geq 2k-1$.

With IA code construction, a data segment of size B is divided into k strips of equal lengths, and then encoded into n data blocks denoted by $b_1, b_2, \ldots, b_n$ with block ID $1, 2, \ldots, n$ respectively. Each data block $b_i$ consists of $\alpha$ data sub-blocks $b_i=[b_{i1}, b_{i2}, \ldots, b_{i\alpha}]$. According to the related theory of MSR code, an IA code satisfied that $$\alpha = d-k+1 \quad (1)$$

Since IA codes are systematical, the first k data blocks $B=[b_1, b_2, \ldots, b_k]^T$ are original uncoded data, which are also called systematical blocks, and the last $m=n-k$ data blocks are parity blocks denoted by $C=[c_1, c_2, \ldots, c_m]^T=[b_{k+1}, b_{k+2}, \ldots, b_n]^T$. Therefore the whole data segment is divided into $k\alpha$ systematical sub-blocks and then encoded into $m\alpha$ parity sub-blocks, resulting in totally $n\alpha$ sub-blocks. The IA code construction formulas and corresponding notions here are $$C = GB \quad (2)$$

where the encoding matrix is $$G = \begin{bmatrix} G_{11} & G_{12} & \cdots & G_{1k} \\ G_{21} & G_{22} & \cdots & G_{2k} \\ \vdots & & \ddots & \vdots \\ G_{m1} & G_{m2} & \cdots & G_{mk} \end{bmatrix} \quad (3)$$

Note all the computations here are on finite field $GF(q)$. Each sub-encoding matrix is $$G_{ij} = \bar{u}_i \bar{v}_j^T + p_{ji} I \quad (4)$$

where $p_{ji}$ is the entry of $m \times m$ matrix P at jth row and ith column, and P can be a Cauchy or Vardermonde matrix such that each sub-encoding matrix is invertible. Let $U=[u_1, u_2, \ldots, u_m]$ and $V=[v_1, v_2, \ldots, v_m]$ be $m \times m$ invertible matrices that $$U = \kappa^{-1} V'P \quad (5)$$

where $V'=(V^{-1})^T$ is the dual basis of V, and $\kappa \in GF(q)$ satisfying $1-\kappa^2 \neq 0$. $\bar{u}_i$ and $\bar{v}_j$ in formula (4) are sub-vectors consisting of the first $\alpha$ entries of $u_i$ and $v_j$, respectively. I is an $\alpha \times \alpha$ unit vector and thus $G_{ij}$ in formula (4) is an $\alpha \times \alpha$ matrix.

FIG. 1 depicts the system model of concurrent recovery for failed node storage data blocks based on IA code. In the shown distributed storage system, there are totally n nodes denoted by $N=\{N_i | i=1, \ldots, n\}$. Note that the node used herein can be either physical or logical, say, multiple nodes can reside on one or more physical machines, which do not affect the effectiveness of the present disclosure. Each node $N_i$ holds a data block $b_i$, hence $N_1, N_2, \ldots, N_k$ are systematical nodes that store systematical blocks, while $N_{k+1}, \ldots, N_n$ are parity nodes that store parity blocks. Assume that $t_1$ systematical nodes and $t_2$ parity nodes fail, where $t_1, t_2 \geq 0$ and the total number of failed nodes $t=t_1+t_2 \geq 1$. Based on the equality between systematical nodes and parity nodes, without loss of generality, it shows that the nodes $N_1, \ldots, N_{t_1}$ and $N_{k+1}, \ldots, N_{k+t_2}$ fail in FIG. 1. The regenerating node collects helper data from $k-t_1$ surviving systematical nodes and m–$k_2$ surviving parity nodes, then regenerate the lost data blocks on the failed nodes. The surviving nodes that offer helper data sub-blocks are called "assistant node".

Before transmitting helper data sub-blocks to the regenerating nodes, each assistant node needs to encode its own data blocks, which is accomplished by calculating the inner product between $\alpha$ data sub-blocks and encoding vector on GF(q). If systematical block $b_i$ is lost, the encoding vector is $\bar{v}_i'$, where $\bar{v}_i'$ consists of the first $\alpha$ elements of the ith column of V'. And if parity block $c_i$ is lost, the corresponding encoding vector is $\bar{u}_i$. If V is an orthogonal matrix, V'=V and $\bar{v}_i'=\bar{v}_i$. Further if V is an identity matrix, $$\bar{v}_i'=\bar{v}_i=e_i=[0,\ldots 0,1,0,\ldots,0]^T \tag{6}$$

where $e_i$ is a unit vector whose ith element is 1 and other elements are all 0. In this case, if the lost block is systematical block, the assistant nodes only need to send their ith data sub-block to the regenerating node without encoding, thus the computation cost can be reduced and implementation is simpler. In actual storage systems, systematical blocks are used more frequently in read and write operations and have high priority in the recovery, hence such V=I codes are especially useful in practice. Therefore, we mainly consider this kind of IA codes in the present disclosure. If there is no special mentioning, all the following embodiments assume that V=I.

In the present embodiment, the regenerating node recovers the lost data blocks through repair matrix which is obtained through the following procedure.

Without loss of generality, we assume systematical blocks $b_1,\ldots,b_{t_1}$ and parity blocks $c_1,\ldots,c_{t_2}$ are missing, corresponding indices to the failed nodes are $X_{t_1,t_2}=\{1,\ldots,t_1,k+1,\ldots,k+t_2\}$. If the first $t_1$ systematical blocks and the first $t_2$ parity blocks are actually not the lost data blocks, simply rearrange the number of the data blocks and the rows and columns of the encoding matrix to map the missing systematical data blocks and parity blocks to the most front positions. The actual repaired nodes are defined to constitute the list of nodes to be recovered (which is also referred to as "recovery list" for short). Assuming that r denotes the number of nodes in the recovery list, then r=t when there are all t failed nodes to be recovered. The recovery list includes $t_1$ failed systematical nodes and $t_2$ failed parity nodes, the assistant nodes are selected from $k-t_1$ surviving systematical nodes and $\alpha-t_2$ surviving parity nodes, where the total number of the assistant nodes is d–t+1. Since the systematical nodes and parity nodes are equal, it is possible to choose which systematical nodes and parity nodes. Without loss of generality, systematical nodes $N_{t_1+1},\ldots,N_k$ and parity nodes $N_{k+t_2+1},\ldots,N_{d+1}$ are chosen to be the assistant nodes. All surviving systematical nodes must be selected as assistant nodes. Later it will show that how to select assistant nodes when the number of failed nodes to be recovered is less than t.

First, we focus on the sub-repair matrix related to the missing systematical data blocks. For a missing systematical data blocks $b_i$, each assistant node $N_j$ encodes its own data block to be $h_{j,i}=b_j\bar{v}_i$, resulting in a vector $\vec{h}_i=[h_{t_1+1,i},\ldots,h_{k,i},h_{k+t_2+1,i},\ldots,h_{d+1,i}]^T$ formed by helper data.

Then set a following $\alpha\times(t\alpha)$ matrix:

$$\Phi_i = \begin{bmatrix} p_{11}\bar{v}_i^T & \ldots & p_{i-1,1}\bar{v}_i^T & \bar{u}_1^T+p_{i1}\bar{v}_i^T & p_{i+1,1}\bar{v}_i^T & \ldots & p_{t_1,1}\bar{v}_i^T & -\bar{v}_i^T & 0 & \ldots 0 \\ p_{12}\bar{v}_i^T & \ldots & p_{i-1,2}\bar{v}_i^T & \bar{u}_2^T+p_{i2}\bar{v}_i^T & p_{i+1,2}\bar{v}_i^T & \ldots & p_{t_1,2}\bar{v}_i^T & 0 & -\bar{v}_i^T & \ldots 0 \\ \vdots & \ddots & \vdots & \vdots & \vdots & \ddots & \vdots & \vdots & \vdots & \ddots \vdots \\ p_{1\alpha}\bar{v}_i^T & \ldots & p_{i-1,\alpha}\bar{v}_i^T & \bar{u}_\alpha^T+p_{i\alpha}\bar{v}_i^T & p_{i+1,\alpha}\bar{v}_i^T & \ldots & p_{t_1,\alpha}\bar{v}_i^T & \underbrace{0 \quad 0 \quad \ldots 0}_{\text{totally } t_2 - \bar{v}_i^T} \end{bmatrix} \tag{7}$$

where the last $t_2\alpha$ columns in formula (7) contain $t_2$ $-\bar{v}_i^T$ aligned upper-diagonally.

Set a following $\alpha\times(d-t+1)$ matrix:

$$\Gamma_i = \begin{bmatrix} -p_{t_1+1,1} & \ldots & -p_{k,1} & 0 & \ldots & 0 \\ \vdots & \ddots & \vdots & \vdots & \ddots & \vdots \\ -p_{t_1+1,t_2+1} & \ldots & -p_{k,t_2+1} & 1 & \ldots & 0 \\ \vdots & \ddots & \vdots & \vdots & \ddots & \vdots \\ -p_{t_1+1,\alpha} & \ldots & -p_{k,\alpha} & 0 & \ldots & 1 \end{bmatrix} \tag{8}$$

and the right bottom corner of the matrix $\Gamma_i$ is an $(\alpha-t_2)\times(\alpha-t_2)$ identity matrix.

Up to now, all sub-repair matrices for lost systematical blocks have been prepared. Next consider the sub-repair matrix related to missing parity blocks.

For a lost parity block $c_i$, each assistant node $N_j$ encodes its own data block to be $g_{j,i}=b_j\bar{u}_i$, resulting in a vector $\vec{g}_i=[g_{t_1+1,i},\ldots,g_{k,i},g_{k+t_2+1,i},\ldots,g_{d+1,i}]^T$ formed by helper data.

Then calculate an $\alpha\times d$ matrix $\Psi_i$ as followings:

$$\Psi_i = \kappa U' \begin{bmatrix} -p_{11} & \ldots & -p_{k,1} & 1 & \ldots & 0 & 0 & \ldots & 0 \\ \vdots & \ddots & \vdots & \vdots & \ddots & \vdots & \vdots & \ddots & \vdots \\ -p_{1,i-1} & \ldots & -p_{k,i-1} & 0 & \ldots & 1 & 0 & \ldots & 0 \\ \kappa^{-1}p_{1,i} & \ldots & \kappa^{-1}p_{k,i} & 0 & \ldots & 0 & 0 & \ldots & 0 \\ -p_{1,i+1} & \ldots & -p_{k,i+1} & 0 & \ldots & 0 & 1 & \ldots & 0 \\ \vdots & \ddots & \vdots & \vdots & \ddots & \vdots & \vdots & \ddots & \vdots \\ -p_{1\alpha} & \ldots & -p_{k,\alpha} & 0 & \ldots & 0 & 0 & \ldots & 1 \end{bmatrix} + \begin{bmatrix} 1 & \ldots & 0 & \ldots & 0 \\ \vdots & \ddots & \vdots & \ddots & \vdots \\ 0 & \ldots & 1 & \ldots & 0 \\ 0 & \ldots & 0 & \ldots & 0 \\ \vdots & \ddots & \vdots & \ddots & \vdots \\ 0 & \ldots & 0 & \ldots & 0 \end{bmatrix} \tag{9}$$

The right side of formula (9) is composed of two parts. The last α−1 columns of the matrix in the left bracket contain two identity matrices: an i−1 dimensional one on the upper-left corner and an α−i dimensional one on the lower-right corner. The upper-left corner of the matrix in the right bracket is a k×k identity matrix while other entries thereof are all 0.

Figure 2:
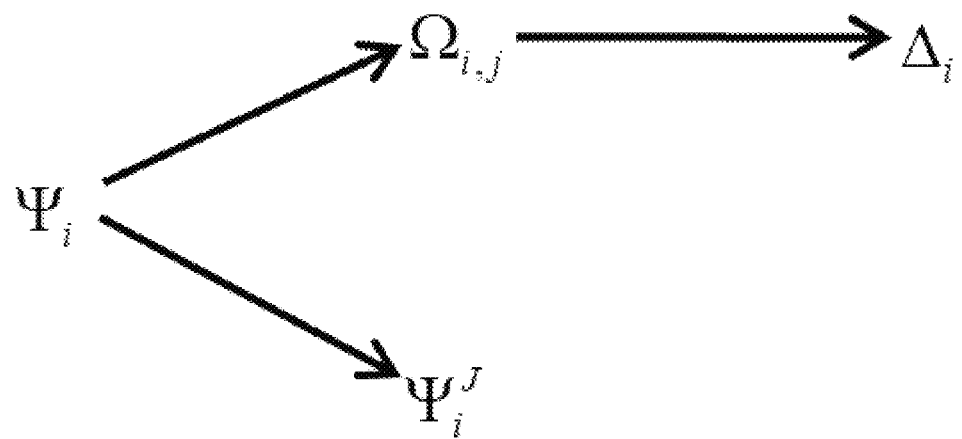
FIG. 2 is a schematic diagram illustrating the computation of sub-repair matrix of parity code.

The sub-repair matrix corresponding to $c_i$ is calculated by using $\Psi_i$, as shown in FIG. 2. Let $\psi_{ij}$ denote the jth column of $\Psi_i$, $J_i=\{j|j=1,\ldots,t_1,k+1,\ldots,k+t_2-1\}$ denote the column indices of $\Psi_i$ corresponding to the missing blocks except $c_i$, and $\Psi_i^J$ denote $\Psi_i$ omitting the columns of IDs $J_i$. Calculate $$\Omega_{i,j}=-\psi_{ij}\bar{u}_i^T \quad (10)$$

for every $j \in J_i$, then let $$\Delta_i=[\Omega_{i,1},\ldots,\Omega_{i,t_1},\Omega_{i,k+1},\ldots,\Omega_{i,k+i-1},I,\Omega_{i,k+i},\ldots,\Omega_{i,k+t_2-1}] \quad (11)$$

Up to now we have all sub-repair matrices for the lost parity blocks.

Now combine all the sub-repair matrices derived above into the whole repair equations:

$$\begin{bmatrix}\Phi_1\\ \vdots\\ \Phi_{t_1}\\ \Delta_1\\ \vdots\\ \Delta_{t_2}\end{bmatrix}\begin{bmatrix}b_1^T\\ \vdots\\ b_{t_1}^T\\ c_1^T\\ \vdots\\ c_{t_2}^T\end{bmatrix}=\begin{bmatrix}\Gamma_1\\ & \ddots\\ & & \Gamma_{t_1}\\ & & & \Psi_1^J\\ & & & & \ddots\\ & & & & & \Psi_{t_2}^J\end{bmatrix}\begin{bmatrix}\bar{h}_1\\ \vdots\\ \bar{h}_{t_1}\\ \bar{g}_1\\ \vdots\\ \bar{g}_{t_2}\end{bmatrix} \quad (12)$$

Let $\Xi=[\Phi_1,\ldots,\Phi_{t_1},\Delta_1,\ldots,\Delta_{t_2}]^T$, $$\Theta=\begin{bmatrix}\Gamma_1\\ & \ddots\\ & & \Gamma_{t_1}\\ & & & \Psi_1^J\\ & & & & \ddots\\ & & & & & \Psi_{t_2}^J\end{bmatrix},$$

then if $\Xi$ is invertible, the repair matrix can be obtained as follows:

$$R=\Xi^{-1}\Theta \quad (13)$$

and the missing data blocks can be regenerated by multiplying the repair matrix R with the helper data sub-blocks.

If the actual missing data blocks are not the first $t_1$ systematical blocks and the first $t_2$ parity blocks, the repair matrix can be calculated in the same way as above through rearranging the number of the data blocks and the rows and columns of the encoding matrix and mapping the missing systematical data blocks and parity blocks to the most front positions.

From the presentation above, it can be seen that with the concurrent recovery method disclosed herein, totally $$W=t(d-t+1) \quad (14)$$

helper data sub-blocks are needed to regenerate t missing data blocks.

Hence the method provided in the present disclosure achieves the lower bound of the network bandwidth of concurrent failure recovery. Besides, the method can save repair bandwidth only when $t<\min\{k,\alpha\}$. When $t\geq\min\{k,\alpha\}$, downloading the whole data segment from the assistant node and then decoding to obtain original data and regenerating the missing data blocks with encoding is more bandwidth-saving. Since IA codes require that $d>2k-1$ and $\alpha\geq k$, hence $\min\{k,\alpha\}=k$. Therefore if it is for the purpose of saving bandwidth, the application scope of the method of the present disclosure is $t<k$.

For some combinations of failed nodes, $\Xi$ may be irreversible and hence the repair matrix cannot be generated through the formula (13). To solve this problem, one can add one or several nodes which may be failed or even surviving ones to the recovery list to make $\Xi$ invertible, or replace some nodes to be recovered with other nodes which may also be failed or even surviving ones, or use decoding to regenerate missing data.

Figure 3:
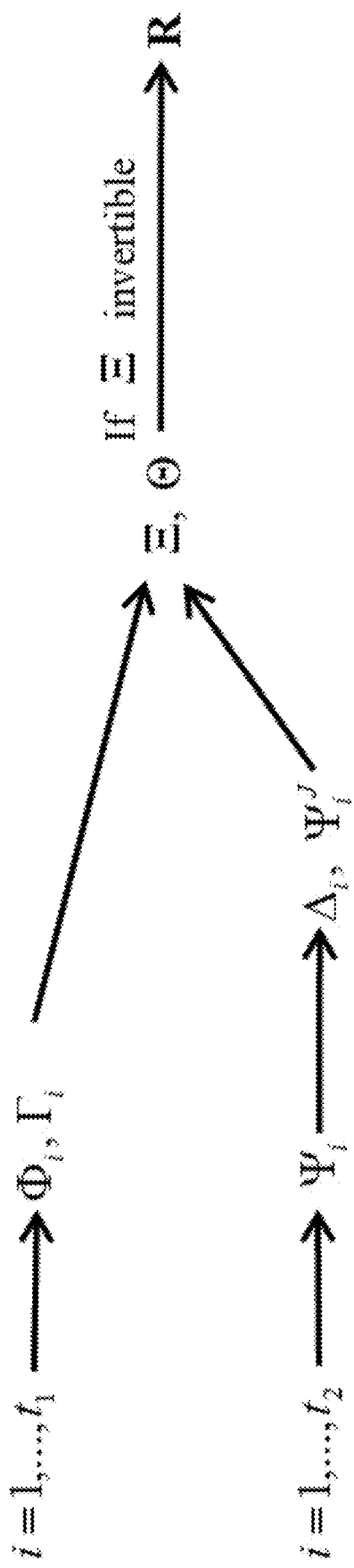
FIG. 3 is a schematic diagram illustrating the computation of repair matrix.

The repair matrix generating process illustrated in FIG. 3 is summarized as follows:

Step 1: for every i where $1\leq i\leq t_1$:
calculating $\Phi_i$ according to formula (7); and
calculating $\Gamma_i$ according to formula (8);
Step 2: for every i where $1\leq i\leq t_2$:
calculating $\Psi_i$ according to formula (9);
for every j where $j\in J_i$:
calculating $\Omega_{i,j}$ according to formula (10); and
generating $\Delta_i$ and $\Psi_i^J$ according to formula (11).
Step 3: combining all $\Phi_i$, $\gamma_i$, $\Delta_i$ and $\Psi_i^J$ obtained in above steps to form $\Xi$ and $\Theta$ according to formula (12).
Step 4: judging $\Xi$ whether is invertible. If $\Xi$ is invertible, calculate the repair matrix R according to formula (13).

From the presentation above, to recover t failed nodes, only $s=d-t+1$ assistant nodes are needed, among them $k-t_1$ are systematical nodes and $d-t+1-(k-t_1)=\alpha-t_2$ are parity nodes. Since IA codes require that $n\geq 2k$ and $d\geq 2k-1$, there may be more than $\alpha-t_2$ surviving parity nodes in a system. From the structure of the encoding matrix of IA codes, all parity nodes are equivalent and interchangeable with each other. Therefore, one can choose any $\alpha-t_2$ out of the $n-k-t_2$ surviving parity nodes as assistant nodes only if is invertible.

Moreover, in another embodiment, if there are enough surviving parity nodes, it may be no need to recover all the missing parity blocks, instead, one can choose to repair $t_2'<t_2$ failed parity nodes according to actual requirements. This can reduce the recovery bandwidth cost in some scenarios such as distributed recovery mode. However, unlike parity blocks, the repair matrix cannot be generated with the same way proposed above; that is, all the failed systematical nodes must be jointly recovered when regenerating lost data via the repair matrix with minimum storage generating code based on IA codes. Therefore, if a regenerating node just needs to regenerate $t_1'$ systematical blocks and $t_2'$ parity blocks where $t_1'\leq t_1$ and $t_2'\leq t_2$, at least $r=t_1+t_2'$ data blocks must be concurrently recovered in actual operation, among which $t_1$ are systematical blocks and $t_2'$ are parity blocks. Currently there are $k-t_1$ surviving systematical nodes and $m-t_2$ surviving parity nodes in the system. Consider the formula (14), $d-(t_1+t_2')+1-(k-t_1)=\alpha-t_2'$ surviving parity nodes are needed as the assistant nodes. If there is so many normal parity nodes, i.e. $m-t_2<\alpha-t_2'$, another $\alpha-t_2'-(m-t_2)$ failed parity nodes have to be added to the list of data blocks to be recovered; and totally $r=t_1+t_2'+\alpha+t_2'-(m-t_2)=t_1+t_2+d+1-n$ nodes need to be concurrently repaired. In either case, $d-r+1$ assistant nodes are needed and each assistant node should offer r uncoded (for missing systematical data blocks) and/or coded (for missing parity blocks) helper data sub-blocks. Therefore the total number of helper data sub-blocks is shown in formula (15) as follows:

$$W = \begin{cases} (t_1 + t_2'(d - t_1 - t_2' + 1) & m - t_2 \geq \alpha - t_2' \text{ and } (t_1 + t_2') < k \\ (t_1 + t_2 + d + 1 - n) & m - t_2 < \alpha - t_2' \text{ and} \\ (n - t_1 - t_2) & t_1 + t_2 + d + 1 - n < k \\ k(d - k + 1) & \text{other cases than the above two conditions and} \\ \text{not recoverable} & \text{otherwise} \end{cases} \quad (15)$$

Thus if one of the first two conditions of formula (15) is met, the concurrent recovery method proposed above can be applied to save recovery bandwidth, and one should first choose all surviving systematical nodes then appropriate number of surviving parity nodes according to formula (15) as the assistant nodes. If there are fewer failed nodes, when V=I, all the systematical nodes can be chosen as the assistant nodes; then their stored data can be directly sent to the regenerating node without encoding the data, greatly reducing the complexity of the calculation. If the first two conditions of formula (15) are not met, decoding has to be adopted to recover data. Note that, with the concurrent recovery method for IA codes proposed by the present disclosure, the number of data blocks that are actually recovered may be different from that of the blocks the regenerating node needs to recover.

Figure 4:
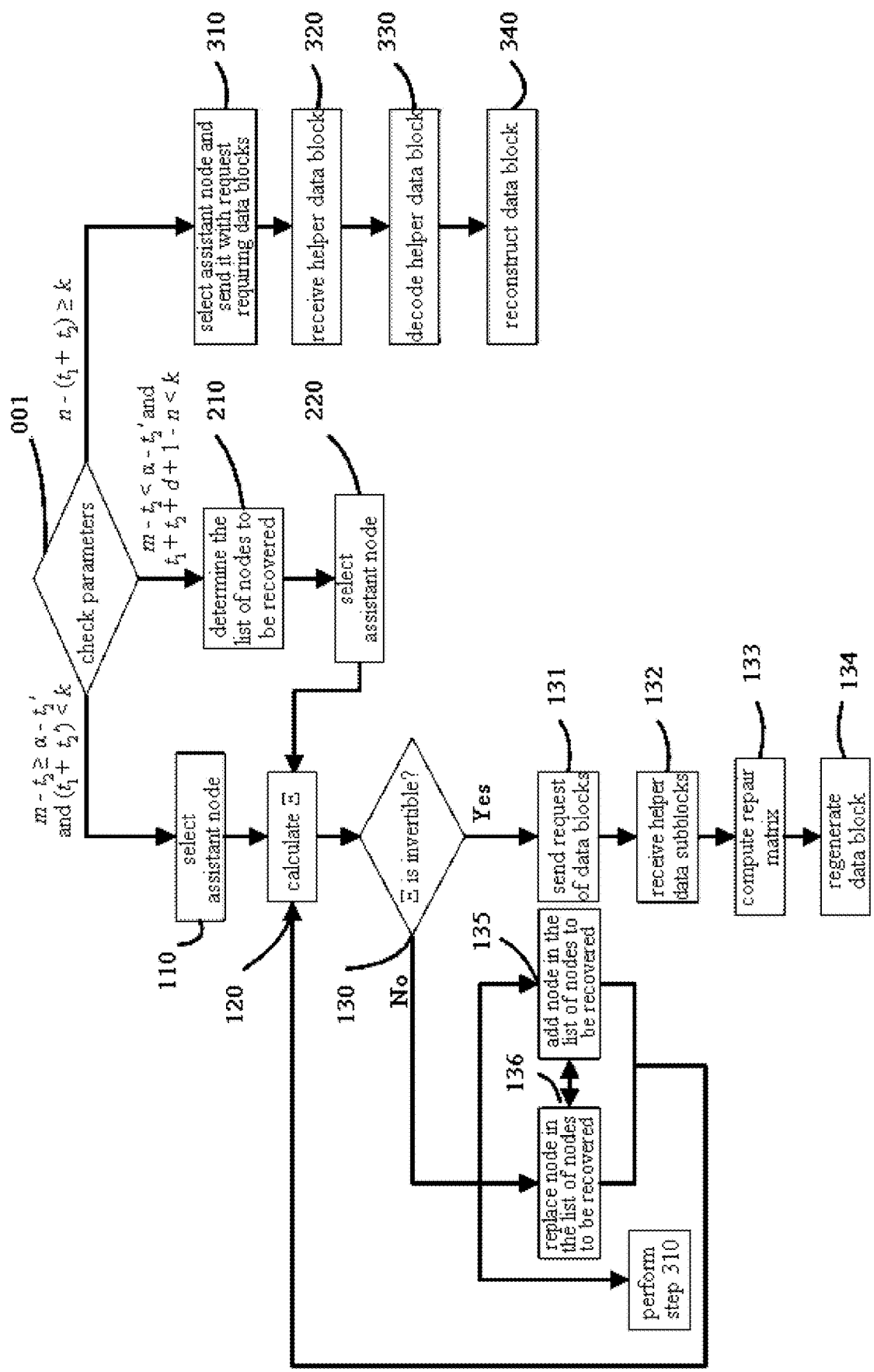
FIG. 4 is a schematic flowchart illustrating the algorithm of concurrent failure recovery.

Based on the above presentation, a concurrent failure recovery algorithm using IA codes for multiple data blocks is illustrated in another embodiment of the present disclosure in its entirety. The specific process thereof is shown in FIG. 4 as follows. Note the 4th condition in formula (15) when the failed data is not recoverable is not presented for brevity.

Step 001: check the parameters against formula (15) to judge the applicable condition for data repair,
if the $1^{st}$ condition is met:
Step 110: setting $r=t_1+t_2'$, selecting all $k-t_1$ surviving systematical nodes and any $\alpha-t_2'$ surviving parity nodes as assistant nodes;
Step 120: calculating $\Xi$ according to the steps shown in FIG. 3;
Step 130: judging whether $\Xi$ is invertible.
If $\Xi$ is invertible, then go to
Step 131: informing each assistant node to offer r uncoded (for missing systematical data blocks) and/or coded (for missing parity blocks) helper data sub-blocks to the regenerating node;
Step 132: the regenerating node waiting until all helper data sub-blocks are received;
Step 133: calculating the repair matrix according to the steps shown in FIG. 3;
Step 134: regenerating the missing data blocks through multiplying the repair matrix with the helper data sub-block.
If $\Xi$ is not invertible, then go to step 310, or to step 135 or step 136;
Step 135: adding a node to the recovery list, letting r=r+1 and re-calculating $\Xi$. If $\Xi$ is invertible, go to perform step 131, otherwise go to perform step 310 or 135 or 136.
Step 136: replacing a node in the recovery list, and re-calculating $\Xi$. If is invertible, go to perform step 131, otherwise go to perform step 310 or 135 or 136.
If all possibilities for r<k have been ergodic during the execution of steps 135, 136, then go to perform step 310.
If the $2^{nd}$ condition is met:
Step 210: besides $t_1$ missing systematical data blocks and $t_2'$ missing parity blocks, adding another $\alpha-t_2'-m+t_2$ missing parity blocks to the recovery, and setting $r=t_1+t_2+d+1-n$;

Step 220: selecting all the surviving nodes as assistant nodes;
Then perform step 120 and step 130 to regenerate the missing data blocks.
If the $3^{rd}$ condition is met:
Step 310: selecting k surviving nodes as assistant nodes, the regenerating node informing each of the assistant nodes to offer one uncoded data block;
Step 320: the regenerating node waiting until all the helper data blocks are received;
Step 330: decoding the received helper data blocks to obtain original data segment; and
Step 340: regenerating the missing data blocks through encoding the original data segment.

Those skilled in the art can understand that all or part of the steps of the various methods in the above-mentioned embodiments can be completed by instructing relevant hardware through a program. When all or parts of the functions in the above embodiments are implemented by a computer program, the program may be stored in a computer-readable storage medium, which includes a program that can be executed by the processor. The storage medium may include: a read-only memory, a random access memory, a magnetic disk, an optical disk, a hard disk, etc., and the program is executed by a computer to realize the above functions. For example, by storing the program in the memory of the computer and executing the program in the memory by the processor, all or part of the above functions can be realized. In addition, when all or part of the functions in the above embodiments are implemented by a computer program, the program may also be stored in a storage medium such as a server, another computer, a magnetic disk, an optical disk, a flash disk, or a mobile hard disk, and saved on local device by downloading or copying; or it may update the version of the system of the local device, and when the program in the memory is executed by the processor, all or part of the functions in the foregoing embodiments can be implemented.

The principle and implementation manners present disclosure has been described above with reference to specific embodiments, which are merely provided for the purpose of understanding the present disclosure and are not intended to limit the present disclosure. It will be possible for those skilled in the art to make variations based on the principle of the present disclosure.

The invention claimed is:

1. A distributed storage system with data concurrent recovery function, the system using minimum storage generating code C(n,k,d) based on interference alignment to encode data needed to be stored, the data being equally divided into k segments and then encoded into n data blocks denoted by $b_1, b_2, \ldots, b_n$ each data block containing $\alpha$ sub-blocks, $\alpha=d-k+1$, d representing repair degree, first k data blocks $B=[b_1, b_2, \ldots, b_k]^T$ representing systematical blocks, rest m=n−k data blocks $\bar{v}_j C=[c_1, c_2, \ldots, c_m]^T=[b_{k+1}, b_{k+2}, \ldots, b_n]^T$ representing parity blocks, then C=GB, G representing encoding matrix, each sub encoding matrix being $G_{ji}=\bar{u}_i\bar{v}_j^T+p_{ji}I$, $p_{ji}$ being entry of m×m matrix P, $\bar{u}_i$ and $\bar{v}_j$ being sub-vectors of first $\alpha$ elements of $u_i$ and $v_j$ respectively, $U=[u_1, u_2, \ldots, u_m]$ and $V=[v_1, v_2, \ldots, v_m]$ being m×m invertible matrices, the system comprising multiple storage nodes each holding a data block, the multiple storage nodes residing on one or more computers each comprising a processor and a storage, the multiple storage nodes comprising systematical nodes that store the systematical blocks, parity nodes that store the parity blocks, and a regenerating node that collects helper data from surviving systematical nodes and surviving parity nodes and regenerates lost data blocks on failed nodes, each surviving node that offers helper data sub-blocks being an assistant node, wherein the system is configured to perform a method of data concurrent recovery comprising following steps:

step 1: obtaining helper data sub-blocks from an assistant node:

letting $N=\{N_i|i=1, \ldots, n\}$ denote n storage nodes, $t_1$ number of failed systematical nodes, $t_2$ number of failed parity nodes, $t=t_1+t_2 \geq 1$ total number of fail nodes, $N_1, \ldots, N_{t_1}$ and $N_{k+1}, \ldots, N_{k+t_2}$ the failed systematical nodes and parity nodes respectively, then selecting assistant nodes from surviving nodes, defining actual repaired nodes to constitute a list of nodes to be recovered, the list containing all or part of $t_1$ failed systematical nodes and $t_2$ failed parity nodes, for each missing systematical data block $b_i$ each assistant node $N_j$ encoding its own data block to be $h_{j,i}=b_j\overline{v}_i$, resulting in a vector $\vec{h}_i=[h_{t_1+1,i}, \ldots, h_{k,i}, h_{k+t_2+1,i}, \ldots, h_{d+1,i}]^T$ form by helper data sub-block, for each missing parity block $c_i$ each assistant node $N_j$ encoding its own data block to be $g_{j,i}=b_j\overline{u}_i$, resulting in a vector $\vec{g}_i=[g_{t_1+1,i}, \ldots, g_{k,i}, g_{k+t_2+1,i}, \ldots, g_{d+1,i}]^T$ form by helper data sub-block, and sending helper data sub-block to a regenerating node;

step 2: setting a sub-repair matrix related to missing data blocks:

a) setting a sub-repair matrix related to missing systematical data blocks:

setting an $\alpha \times (t\alpha)$ matrix:

$$\Phi_i = \begin{bmatrix} p_{11}\overline{v}_i^T & \ldots & p_{i-1,1}\overline{v}_i^T & \overline{u}_1^T + p_{i1}\overline{v}_i^T & p_{i+1,1}\overline{v}_i^T & \ldots & p_{t_1,1}\overline{v}_i^T & -\overline{v}_i^T & 0 & \ldots & 0 \\ p_{12}\overline{v}_i^T & \ldots & p_{i-1,2}\overline{v}_i^T & \overline{u}_2^T + p_{i2}\overline{v}_i^T & p_{i+1,2}\overline{v}_i^T & \ldots & p_{t_1,2}\overline{v}_i^T & 0 & -\overline{v}_i^T & \ldots & 0 \\ \vdots & \ddots & \vdots & \vdots & \vdots & \ddots & \vdots & \vdots & & \ddots & \vdots \\ p_{1\alpha}\overline{v}_i^T & \ldots & p_{i-1,\alpha}\overline{v}_i^T & \overline{u}_\alpha^T + p_{i\alpha}\overline{v}_i^T & p_{i+1,\alpha}\overline{v}_i^T & \ldots & p_{t_1,\alpha}\overline{v}_i^T & 0 & 0 & \cdots & 0 \\ & & & & & & & \multicolumn{4}{c}{\text{totally } t_2 - \overline{v}_i^T} \end{bmatrix}$$

where last $t_2\alpha$ columns contain $t_2$ $-\overline{v}_i^T$ aligned upper-diagonally, setting an $\alpha \times (d-t+1)$ matrix:

$$\Gamma_i = \begin{bmatrix} -p_{t_1+1,1} & \cdots & -p_{k,1} & 0 & \cdots & 0 \\ \vdots & \ddots & \vdots & \vdots & \ddots & \vdots \\ -p_{t_1+1,t_2+1} & \cdots & -p_{k,t_2+1} & 1 & \cdots & 0 \\ \vdots & \ddots & \vdots & \vdots & \ddots & \vdots \\ -p_{t_1+1,\alpha} & \cdots & -p_{k,\alpha} & 0 & \cdots & 1 \end{bmatrix}$$

where right bottom corner thereof is an $(\alpha-t_2)\times(\alpha-t_2)$ identity matrix, b) setting a sub-repair matrix related to missing parity blocks:

setting an $\alpha \times d$ matrix $\Psi_i$:

$$\Psi_i = \kappa U' \begin{bmatrix} -p_{11} & \ldots & -p_{k,1} & 1 & \ldots & 0 & 0 & \ldots & 0 \\ \vdots & \ddots & \vdots & \vdots & \ddots & \vdots & \vdots & \ddots & \vdots \\ -p_{1,i-1} & \ldots & -p_{k,i-1} & 0 & \ldots & 1 & 0 & \ldots & 0 \\ \kappa^{-1}p_{1,i} & \ldots & \kappa^{-1}p_{k,i} & 0 & \ldots & 0 & 0 & \ldots & 0 \\ -p_{1,i+1} & \ldots & -p_{k,i+1} & 0 & \ldots & 0 & 1 & \ldots & 0 \\ \vdots & \ddots & \vdots & \vdots & \ddots & \vdots & \vdots & \ddots & \vdots \\ -p_{1\alpha} & \ldots & -p_{k,\alpha} & 0 & \ldots & 0 & 0 & \ldots & 1 \end{bmatrix} + \begin{bmatrix} 1 & \ldots & 0 & \ldots & 0 \\ \vdots & \ddots & \vdots & \ddots & \vdots \\ 0 & \ldots & 1 & \ldots & 0 \\ 0 & \ldots & 0 & \ldots & 0 \\ \vdots & \ddots & \vdots & \ddots & \vdots \\ 0 & \ldots & 0 & \ldots & 0 \end{bmatrix}$$

wherein $\Psi_i$ is composed of: a sum of a matrix in a left bracket and a matrix in a right bracket, wherein last $\alpha-1$ columns of the matrix in left bracket containing two identity matrices, upper-left corner of the matrix in right bracket being a $k \times k$ identity matrix and other entries thereof being all zero, setting a sub-repair matrix corresponding to $c_i$ by using $\Psi_i$:

for each $j \in J_i$, calculating $\Omega_{i,j} = -\psi_{ij}\overline{u}_i^T$, where $\psi_{ij}$ denotes jth column of $\Psi_i$, $J_i=\{j|j+1, \ldots, t_1, k+1, \ldots, k+t_2-1\}$ denotes column indices of $\Psi_i$ corresponding to missing blocks except $c_i$, then letting $\Delta_i=[\Omega_{i,1}, \ldots, \Omega_{i,t_1}, \Omega_{i,k+1}, \ldots, \Omega_{i,k+i-1}, I, \Omega_{i,k+i}, \ldots, \Omega_{i,k+t_2-1}]$, and denoting $\Psi_i^J$ omitting columns of IDs $J_i$ by $\Psi_i^J$; and step 3: setting a repair matrix and regenerating missing data blocks:

combining sub-repair matrix obtained in step 2:

$$\begin{bmatrix} \Phi_1 \\ \vdots \\ \Phi_{t_1} \\ \Delta_1 \\ \vdots \\ \Delta_{t_2} \end{bmatrix} \begin{bmatrix} b_1^T \\ \vdots \\ b_{t_1}^T \\ c_1^T \\ \vdots \\ c_{t_2}^T \end{bmatrix} = \begin{bmatrix} \Gamma_1 & & & & \\ & \ddots & & & \\ & & \Gamma_{t_1} & & \\ & & & \Psi_1^J & \\ & & & & \ddots \\ & & & & & \Psi_{t_2}^J \end{bmatrix} \begin{bmatrix} \overline{h}_1 \\ \vdots \\ \overline{h}_{t_1} \\ \overline{g}_1 \\ \vdots \\ \overline{g}_{t_2} \end{bmatrix}$$

letting $\Xi=[\Phi_1, \ldots, \Phi_{t_1}, \Delta_1, \ldots, \Delta_{t_2}]^T$, $$\Theta = \begin{bmatrix} \Gamma_1 & & & & & \\ & \ddots & & & & \\ & & \Gamma_{t_1} & & & \\ & & & \Psi_1^J & & \\ & & & & \ddots & \\ & & & & & \Psi_{t_2}^J \end{bmatrix},$$

then repair matrix being $R=\Xi^{-1}\Theta$, and multiplying the repair matrix with the helper data sub-blocks to regenerate missing data blocks.

2. The system of claim 1, wherein the list of nodes to be recovered comprises part nodes of $t_1$ failed systematical nodes and $t_2$ failed parity nodes, number of failed nodes prepared to be recovered is $t_2'$, then according to number of surviving parity nodes, number of assistant nodes needed is $d-r+1$, where $r=t_1+t_2'$ or $r=t_1+t_2+d+1-n$ is number of nodes in the list.

3. The system of claim 1, wherein $N_1, \ldots, N_{t_1}$, and $N_{k+1}, \ldots, N_{k+t_2}$ represent failed systematical nodes and failed parity nodes, respectively, which does not limit to scenario where the failed systematical nodes and failed parity nodes are first $t_1$ systematical nodes and first $t_2$ parity nodes; the method is applicable to scenario where the failed systematical nodes and failed parity nodes are failed nodes located at any sorted position.

4. The system of claim 1, wherein V is an identity matrix.

5. The system of claim 1, wherein the repair matrix is applicable to t<k, and when t≥k, missing data blocks are regenerated by decoding in this way: first downloading whole data segment, then decoding to obtain original data, and regenerating missing data blocks with encoding.

6. The system of claim 1, wherein $\Xi$ is an invertible matrix, or $\Xi$ turns to be invertible by adding a node to list of nodes to be recovered, or replacing some nodes to be recovered with other nodes; otherwise missing data is regenerated by decoding.

7. The system of claim 1, wherein the regenerating node is a proxy node in a centralize mode or a new node in a distributed mode.

8. A non-transitory computer-readable storage medium, comprising a program which can be executed by the system according to claim 1.

* * * * *